United States Patent
Lee et al.

(10) Patent No.: US 10,755,981 B2
(45) Date of Patent: Aug. 25, 2020

(54) DISPLAY DEVICE MANUFACTURING METHOD

(71) Applicant: LG INNOTEK CO., LTD., Seoul (KR)

(72) Inventors: Sang Youl Lee, Seoul (KR); Chung Song Kim, Seoul (KR); Ji Hyung Moon, Seoul (KR); Sun Woo Park, Seoul (KR); Hyeon Min Cho, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/475,874

(22) PCT Filed: Jan. 5, 2018

(86) PCT No.: PCT/KR2018/000277
§ 371 (c)(1),
(2) Date: Jul. 3, 2019

(87) PCT Pub. No.: WO2018/128471
PCT Pub. Date: Jul. 12, 2018

(65) Prior Publication Data
US 2019/0378760 A1 Dec. 12, 2019

(30) Foreign Application Priority Data

Jan. 5, 2017 (KR) .................. 10-2017-0001906

(51) Int. Cl.
*H01L 21/78* (2006.01)
*H01L 21/268* (2006.01)
(Continued)

(52) U.S. Cl.
CPC ............ *H01L 21/78* (2013.01); *H01L 21/268* (2013.01); *H01L 21/52* (2013.01); *H01L 27/15* (2013.01); *H05B 33/10* (2013.01)

(58) Field of Classification Search
CPC ... H01L 21/78; H01L 21/268; H01L 21/6835; H01L 27/15
See application file for complete search history.

(56) References Cited

U.S. PATENT DOCUMENTS

| 2008/0020547 A1 | 1/2008 | Kostrzewa et al. |
| 2013/0203195 A1 | 8/2013 | Kim et al. |

(Continued)

FOREIGN PATENT DOCUMENTS

| JP | 5712700 B2 * | 5/2015 |
| KR | 10-2013-0091501 | 8/2013 |

(Continued)

OTHER PUBLICATIONS

International Search Report (with English Translation) and Written Opinion dated Apr. 17, 2018 issued in Application No. PCT/KR2018/000277.

*Primary Examiner* — Michele Fan
(74) *Attorney, Agent, or Firm* — Ked & Associates, LLP

(57) ABSTRACT

An embodiment provides a display device manufacturing method comprising the steps of: preparing a substrate having a plurality of semiconductor chips arranged thereon (S1); bonding at least one first semiconductor chip of the plurality of semiconductor chips to a transfer member (S2); irradiating laser light to the first semiconductor chip to separate the first semiconductor chip from the substrate (S3); disposing the first semiconductor chip on a panel substrate of a display device by means of the transfer member (S4); and irradiating light to the transfer member to separate the first semiconductor chip from the transfer member (S5), wherein the transfer member comprises: a transfer layer and a bonding layer disposed on one surface of the transfer layer; the bonding layer comprises at least one bonding protrusion; and the first semiconductor chip is bonded to the bonding protrusion in step S2.

20 Claims, 10 Drawing Sheets

(51) Int. Cl.
*H01L 21/52* (2006.01)
*H01L 27/15* (2006.01)
*H05B 33/10* (2006.01)

(56) References Cited

U.S. PATENT DOCUMENTS

| | | |
|---|---|---|
| 2017/0263837 A1 | 9/2017 | Jeon et al. |
| 2018/0053742 A1* | 2/2018 | Ting .................... H01L 33/0095 |
| 2018/0204973 A1* | 7/2018 | Jeung ...................... H01L 33/62 |
| 2019/0035817 A1* | 1/2019 | Park .................... H01L 25/0753 |
| 2019/0088480 A1* | 3/2019 | Budd .................. H01L 21/2007 |

FOREIGN PATENT DOCUMENTS

| | | |
|---|---|---|
| KR | 10-2016-0031633 | 3/2016 |
| KR | 10-1620469 | 5/2016 |
| KR | 10-2016-0087264 | 7/2016 |

* cited by examiner

DISPLAY DEVICE MANUFACTURING METHOD

CROSS-REFERENCE TO RELATED PATENT APPLICATIONS

This application is a U.S. National Stage Application under 35 U.S.C. § 371 of PCT Application No. PCT/KR2018/000277, filed Jan. 5, 2018, which claims priority to Korean Patent Application No. 10-2017-0001906, filed Jan. 5, 2017, whose entire disclosures are hereby incorporated by reference.

TECHNICAL FIELD

Embodiments relate to a display device manufacturing method.

Background Art

A display device is generally used as a display screen for a notebook computer, a tablet computer, a smart phone, a portable display apparatus, and a portable information apparatus in addition to a display device for a television or monitor.

A liquid crystal display and an organic light emitting display are configured to display an image using a thin film transistor as a switching element. Because the liquid crystal display is not a self-emitting type, the image is displayed using light emitted from a backlight unit disposed under a liquid crystal display panel.

Recently, the research and development for a light emitting diode display using a micro light emitting element have been progressing. The above light emitting diode display has been spotlighted as a next generation display due to high image quality and high reliability. However, in the process of transferring the micro light emitting element to a thin film transistor array substrate, foreign substances adhere to a donor formed of a bonding agent when the donor is repeatedly used, and thus the defect rate increases. In addition, when the donor is re-molded continuously, amounts of the consumed bonding agent increase, and thus the manufacturing cost increases.

Technical Problem

An embodiment is directed to providing a display device manufacturing method capable of improving the efficiency and accuracy of a process.

An embodiment is directed to providing a display device manufacturing method capable of reducing the manufacturing cost.

The problems to be solved in the embodiments are not limited thereto and may also include objects and effects comprehended from the technical solution and embodiments described below.

TECHNICAL SOLUTION

One aspect according to an embodiment of the present invention provides a display device manufacturing method including: preparing a substrate on which a plurality of semiconductor chips are disposed (S1); bonding at least one first semiconductor chip among the semiconductor chips to a transfer member (S2); separating the first semiconductor chip from the substrate by irradiating the first semiconductor chip with laser light (S3); disposing the first semiconductor chip on a panel substrate of a display device using the transfer member (S4); and separating the first semiconductor chip from the transfer member by irradiating the transfer member with light (S5), wherein the transfer member includes a transfer layer and a bonding layer disposed on one surface of the transfer layer, the bonding layer includes at least one bonding protrusion, and the first semiconductor chip may be bonded to the bonding protrusion in step S2.

Advantageous Effects

According to an exemplary embodiment, the efficiency and accuracy of a display device manufacturing method can be improved.

According to an exemplary embodiment, the manufacturing costs of the display device can be reduced.

The various and useful advantages and effects of the present invention are not limited to the above description and may be more easily understood in the course of describing specific embodiments of the present invention.

MODES OF THE INVENTION

The embodiments herein may be modified in other forms, or various embodiments may be combined with each other, and the scope of the present invention is not limited to the embodiments described below.

Although an item described in a specific embodiment is not described in other embodiments, the item may be understood as a description relevant to the other embodiments unless stated otherwise or contradictorily stated in the other embodiments.

For example, when features for configuration A are described in a specific embodiment and features for configuration B are described in another embodiment, although an embodiment for the configurations A and B combined with each other is not explicitly described, the configurations shall be understood as being covered within the scope of the invention unless otherwise stated or contradictorily stated in the other embodiments.

In the description of the embodiment, when an element is described as being formed "on or under" another element, the expression "on or under" may include that two elements come into direct contact with each other or at least one of the other elements is arranged between the two elements. In addition, the expression "on or under" may include not only the upward direction but also the downward direction with respect to one element.

Hereinafter, embodiments of the present invention will be described in detail with reference to the accompanying drawings so that those skilled in the art may easily carry out the present invention.

Figure 1:
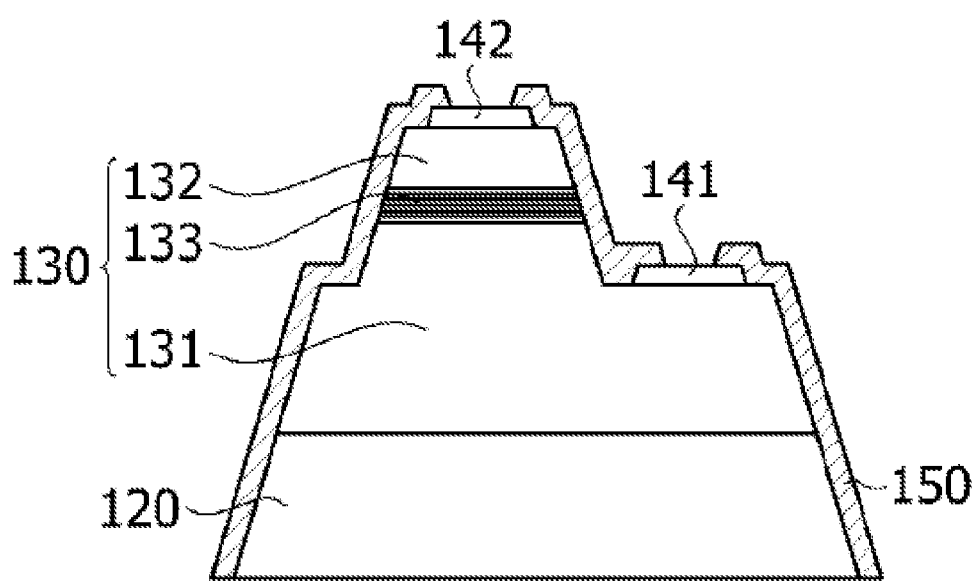
FIG. 1 is a conceptual diagram of a semiconductor element in a display device according to an embodiment of the present invention.

FIG. 1 is a conceptual diagram of a semiconductor element in a display device according to an embodiment of the present invention.

Referring to FIG. 1, a semiconductor element 100 according to the embodiments of the present invention may include a semiconductor structure 130 and electrodes 141 and 142. In addition, the semiconductor element 100 may further include a bonding layer 120 and an insulating layer 150. The semiconductor device 100 according to the present invention may be a light emitting device. In addition, hereinafter, the semiconductor element 100 may be described as a semiconductor chip.

The semiconductor structure 130 may be disposed on the bonding layer 120 to be described below. The semiconductor structure 130 may include a first conductive semiconductor layer 131, a second conductive semiconductor layer 132 and an active layer 133.

The first conductive semiconductor layer 131 may be implemented using at least one of compound semiconductors such as a group III-V compound semiconductor and a group II-VI compound semiconductor. The first conductive semiconductor layer 131 may be formed of a semiconductor material having a composition formula of $In_xAl_yGa_{1-x-y}N$ ($0 \leq x \leq 1$, $0 \leq y \leq 1$, $0 \leq x+y \leq 1$), or a material selected from AlInN, AlGaAs, GaP, GaAs, GaAsP, and AlGaInP. The first conductive semiconductor layer 131 may be doped with a first dopant. The first dopant may be an n-type dopant such as Si, Ge, Sn, Se, or Te. In other words, the first conductive semiconductor layer 131 may be an n-type semiconductor layer doped with the n-type dopant.

The second conductive semiconductor layer 132 may be implemented using at least one of compound semiconductors such as a group III-V compound semiconductor and a group II-VI compound semiconductor. The second conductive semiconductor layer 132 may be formed of a semiconductor material having a composition formula of $In_xAl_yGa_{1-x-y}N$ ($0 \leq x \leq 1$, $0 \leq y \leq 1$, $0 \leq x+y \leq 1$), or a material selected from AlInN, AlGaAs, GaP, GaAs, GaAsP, and AlGaInP. The second conductive semiconductor layer 132 may be doped with a second dopant. The second dopant may be a p-type dopant such as Mg, Zn, Ca, Sr, or Ba. In other words, the second conductive semiconductor layer 132 may be a p-type semiconductor layer doped with the p-type dopant.

The active layer 133 may be disposed between the first conductive semiconductor layer 131 and the second conductive semiconductor layer 132. The active layer 133 is a layer where electrons (or holes) injected through the first conductive semiconductor layer 131 and holes (or electrons) injected through the second conductive semiconductor layer 132 meet. The active layer 133 may transition to a low energy level when the electrons are recombined with the holes and may generate light having a wavelength corresponding thereto.

The active layer 133 may have any one of a single well structure, a multiple well structure, a single quantum well structure, a multi-quantum well (MQW) structure, a quantum dot structure, and a quantum wire structure, but the present invention is not limited thereto. When the active layer 133 is formed to have a well structure, a well layer/barrier layer of the active layer 133 may be formed to have a pair structure of at least one of InGaN/GaN, InGaN/InGaN, GaN/AlGaN, InAlGaN/GaN, GaAs(InGaAs)/AlGaAs, and GaP(InGaP)/AlGaP but is not limited thereto. The well layer may be formed of a material having a band gap smaller than a band gap of the barrier layer.

The electrodes 141 and 142 may include a first electrode 141 and a second electrode 142. The first electrode 141 may be disposed on the first conductive semiconductor layer 131. The first electrode 141 may be electrically connected to the first conductive semiconductor layer 131. The second electrode 142 may be disposed on the second conductive semiconductor layer 132. The second electrode 142 may be electrically connected to the second conductive semiconductor layer 132.

The first electrode 141 and the second electrode 142 may be disposed on different planes. In other words, as shown in the drawing, the first electrode 141 may be disposed under the second electrode 142. However, the present invention is not limited thereto.

The electrodes 141 and 142 may be formed of a material, such as Ti, Ru, Rh, Ir, Mg, Zn, Al, In, Ta, Pd, Co, Ni, Si, Ge, Ag, Pt, or Au, having high reflectance, or formed into a single layer or multiple layers formed by mixing the above material having high reflectance with a transparent conductive material such as IZO, IZTO, IAZO, IGZO, IGTO, AZO, or ATO, but the present invention is not limited thereto.

The bonding layer 120 may be disposed under the semiconductor structure 130. The bonding layer 120 may be disposed between a sacrificial layer 115 to be described later and the semiconductor structure 130. In other words, the bonding layer 120 may allow the semiconductor structure 130 to be easily deposited on the sacrificial layer 115. The bonding layer 120 may include a resin, but the present invention is not limited thereto. In addition, the bonding layer 120 may be omitted in some cases.

Figure 3A:
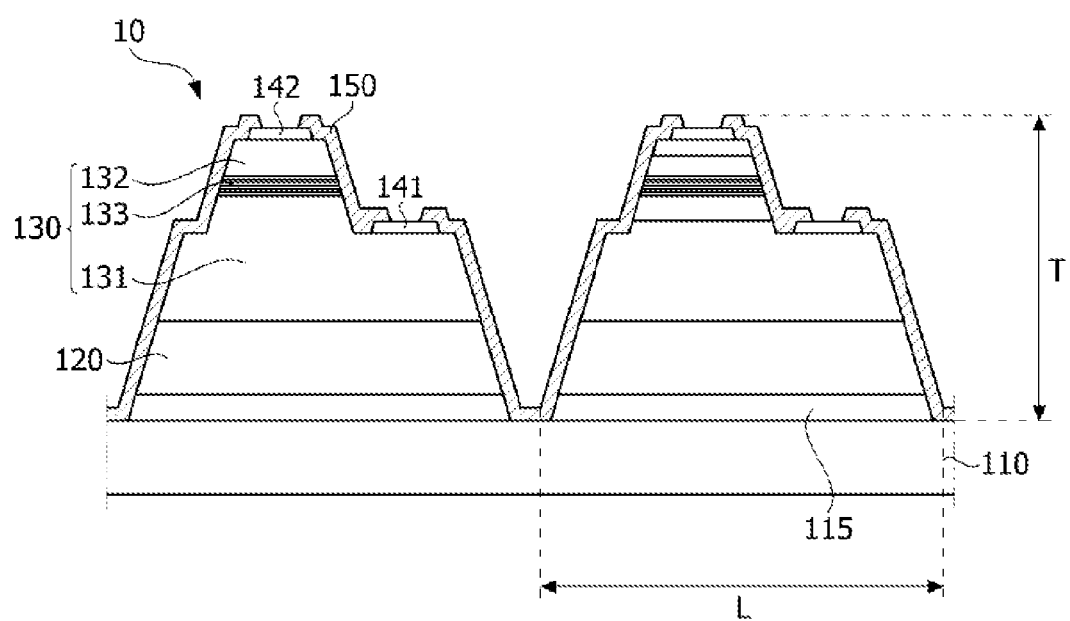
FIGS. 3A to 3H sequentially illustrate a display device manufacturing method according to an embodiment of the present invention.

In addition, the sacrificial layer (115 in FIG. 3C) may be disposed on the substrate (110 in FIG. 3A).

The sacrificial layer may include oxide or nitride. However, the present invention is not limited thereto.

The bonding layer 120 may be disposed on the sacrificial layer to enable the semiconductor structure 130 to be easily disposed on the sacrificial layer. However, when the sacrificial layer is formed of a material similar to that of the semiconductor structure 130, the bonding layer 120 may be omitted. Specifically, the semiconductor structure 130 may be disposed on the sacrificial layer. In this case, the sacrificial layer may be epitaxially grown on the substrate and include an oxiade-based material as a material in which deformation occurring during the epitaxial growth is low. For example, GaN may be included.

The insulating layer 150 may be disposed to cover the semiconductor structure 130 while exposing only parts of the electrodes 141 and 142. The semiconductor structure 130 may be insulated from the outside by the insulating layer 150. The insulating layer 150 may include at least one of $SiO_2$, $Si_xO_y$, $Si_3N_4$, $Si_xN_y$, $SiO_xN_y$, $Al_2O_3$, $TiO_2$, and AlN, but the present invention is not limited thereto.

Figure 2:
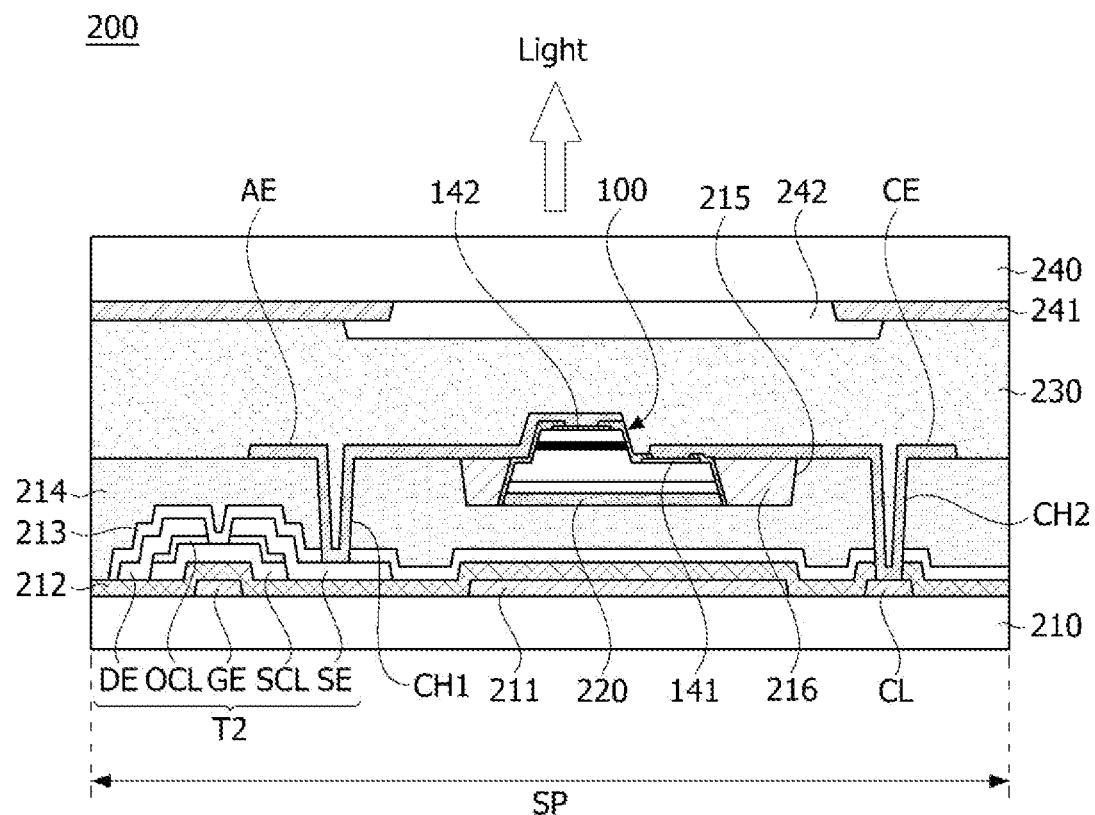
FIG. 2 is a sectional view of a display device according to an embodiment of the present invention.

FIG. 2 is a sectional view of a display device according to an embodiment of the present invention.

Referring to FIG. 2, a display device 200 according to the embodiment of the present invention may include a first substrate 210, a semiconductor element 100, an encapsulation layer 230, and a second substrate 240. Here, the semiconductor element 100 may be the semiconductor element shown in FIG. 1. The display device 200 shown in the drawing may be defined as a sub-pixel as a minimum unit area in which light is emitted. In other words, the above display device 200 shows only one pixel SP for convenience of description and may actually include a plurality of pixels SP.

The first substrate 210 may include a driving thin film transistor T2, a reflective layer 211, a gate insulating layer 212, an interlayer insulating layer 213, a planarization layer 214, and a groove 215.

The driving thin film transistor T2 may include a gate electrode GE, a semiconductor layer SCL, an ohmic contact layer OCL, a source electrode SE, and a drain electrode DE.

The gate electrode GE may be disposed on the first substrate 210 together with a gate line (not shown). The gate electrode GE may be covered by the gate insulating layer 212.

The semiconductor layer SCL may be disposed in a predetermined pattern (or island) on the gate insulating layer 212 to overlap the gate electrode GE. The semiconductor layer SCL may be formed of a semiconductor material composed of any one of amorphous silicon, polycrystalline silicon, oxide, and an organic material, but the present invention is not limited thereto.

The ohmic contact layer OCL may be disposed in a predetermined pattern (or island) on the semiconductor layer SCL. The ohmic contact layer OCL is configured for ohmic contact between the semiconductor layer SCL and the source/drain electrodes SE and DE and may be omitted in some cases.

The source electrode SE may be disposed on one side of the ohmic contact layer OCL to overlap one side of the semiconductor layer SCL.

The drain electrode DE may be disposed on the other side of the ohmic contact layer OCL so as to be spaced apart from the source electrode SE while overlapping the other side of the semiconductor layer SCL. The drain electrode DE may be formed together with the source electrode SE.

A common power line CL may be disposed on the first substrate 210. The common power line CL may receive common power from the outside. The common power line CL may be electrically separated from the gate line (not shown) electrically connected to the gate electrode GE.

The reflective layer 211 may be disposed to overlap the semiconductor element 100 in the vertical direction. The reflective layer 211 may be disposed between a bottom surface of the groove 215 and the first substrate 210. The reflective layer 211 may reflect light incident from the semiconductor element 100 toward the second substrate 240. Thus, according to the present invention, a light emitting diode (light emitting device) display may have a top emission structure. However, the present invention is not limited to the above structure.

The gate insulating layer 212 may be composed of a single layer or multiple layers formed of an inorganic material and may be formed of silicon oxide (SiOx), silicon nitride (SiNx), or the like.

The interlayer insulating layer 213 may be disposed on an entire surface of the first substrate 210 to cover the driving thin film transistor T2. The interlayer insulating layer 213 may be formed of an inorganic material such as silicon oxide (SiOx) or silicon nitride (SiNx) or an organic material such as benzocyclobutene and photo acryl. Meanwhile, the interlayer insulating layer 213 may be omitted in some cases.

The planarization layer (or protective film) 214 may be disposed on an entire surface of the substrate 110 to cover the interlayer insulating layer 213. The planarization layer 214 may provide a flat surface on the interlayer insulating layer 213 while protecting the driving thin film transistor T2. The planarization layer 214 may be formed of an organic material such as benzocyclobutene or photo acryl but may also be formed of a photo-acrylic material for convenience of process.

The groove 215 may be formed in the light emitting area defined in the pixel SP to accommodate the semiconductor element 100. The groove 215 may have a predetermined depth from the planarization layer 214. The groove 215 may have a depth corresponding to a thickness (or total height) of the semiconductor element 100. For example, the groove 215 may have a depth less than the thickness (or total height) of the semiconductor element 100. In other words, in this case, the semiconductor element 100 may protrude upward from the groove 215. In addition, the groove 215 may have a depth such that the first electrode 141 of the semiconductor element 100 is disposed on the same plane as the planarization layer 214. However, the present invention is not limited thereto.

A filler 216 may be filled in the groove 215 with the semiconductor element 100 disposed therein. The filler 216 may be formed of a thermosetting resin or a photocurable resin. The filler 216 may be filled in the groove 215 and then cured to planarize an upper surface of a peripheral space of the groove 215 while removing air gaps in the groove 215. In addition, the filler 216 may fix the semiconductor element 100. Further, the filler 216 may allow the semiconductor element 100 to be electrically isolated from other areas.

A fixing layer 220 may fix the semiconductor element 100 to the groove 215. The fixing layer 220 may be disposed between the semiconductor element 100 and the bottom surface of the groove 215.

As an example, the fixing layer 220 may be coated on a lower surface of the semiconductor element 100 so as to adhere to the bottom surface of the groove 215 in the process of transferring the semiconductor element 100 to the groove 215. As another example, the fixing layer 220 may be dotted on the bottom surface of the groove 215 and spread by a pressing force applied during the transfer process of the semiconductor element 100 so that the semiconductor element 100 may adhere to the bottom surface of the groove 215. Thus, according to the present invention, the semiconductor element 100 simply adheres to the bottom surface of the groove 215 so that the transferring process time of the semiconductor element 100 can be shortened.

A pixel electrode AE may electrically connect the source electrode SE of the driving thin film transistor T2 to the second electrode 142 of the semiconductor device 100. The pixel electrode AE may be connected to the source electrode SE of the driving thin film transistor T2 through a first contact hole CH1 formed in the planarization layer 314.

A common electrode CE may electrically connect the common power line CL to the first electrode 141 of the semiconductor device 100. The common electrode CE may be connected to the common power line CL through a second contact hole CH2 formed in the planarization layer 314.

Each of the pixel electrode AE and the common electrode CE may be formed of a transparent conductive material. The transparent conductive material may be formed of a material such as indium tin oxide (ITO) or indium zinc oxide (IZO), but the present invention is not limited thereto.

The encapsulation layer 230 may be disposed to cover an upper surface of the first substrate 210. The encapsulation layer 230 may be disposed between the first substrate 210 and the second substrate 240. In other words, the encapsulation layer 230 may be coated on the upper surface of the first substrate 210 so that the pixel SP and the semiconductor element 100 can be protected.

The second substrate 240 may be disposed on the first substrate 210 and the encapsulation layer 230. The second substrate 240 may be formed of a transparent glass material or a transparent plastic material. The second substrate 240 may include a black matrix 241 and a light extraction layer 242. The black matrix 241 and the light extraction layer 242 may be disposed on the encapsulation layer 230.

The black matrix 241 may define an opening area overlapping the light emitting area of the first substrate 210. In other words, the black matrix 241 may be disposed to expose the light emitting area of each pixel SP of the second substrate 240. The black matrix 241 may prevent color mixing between adjacent opening areas.

The light extraction layer 242 may be disposed in the opening area defined by the black matrix 241. The light extraction layer 242 may be formed of a transparent material to extract light emitted from the semiconductor element 100 to the outside. Meanwhile, the light extraction layer 242 may be composed of a red, green or blue color filter corresponding to a color defined in the unit pixel SP.

FIGS. 3A to 3H sequentially illustrate a display device manufacturing method according to an embodiment of the present invention.

Figure 3B:
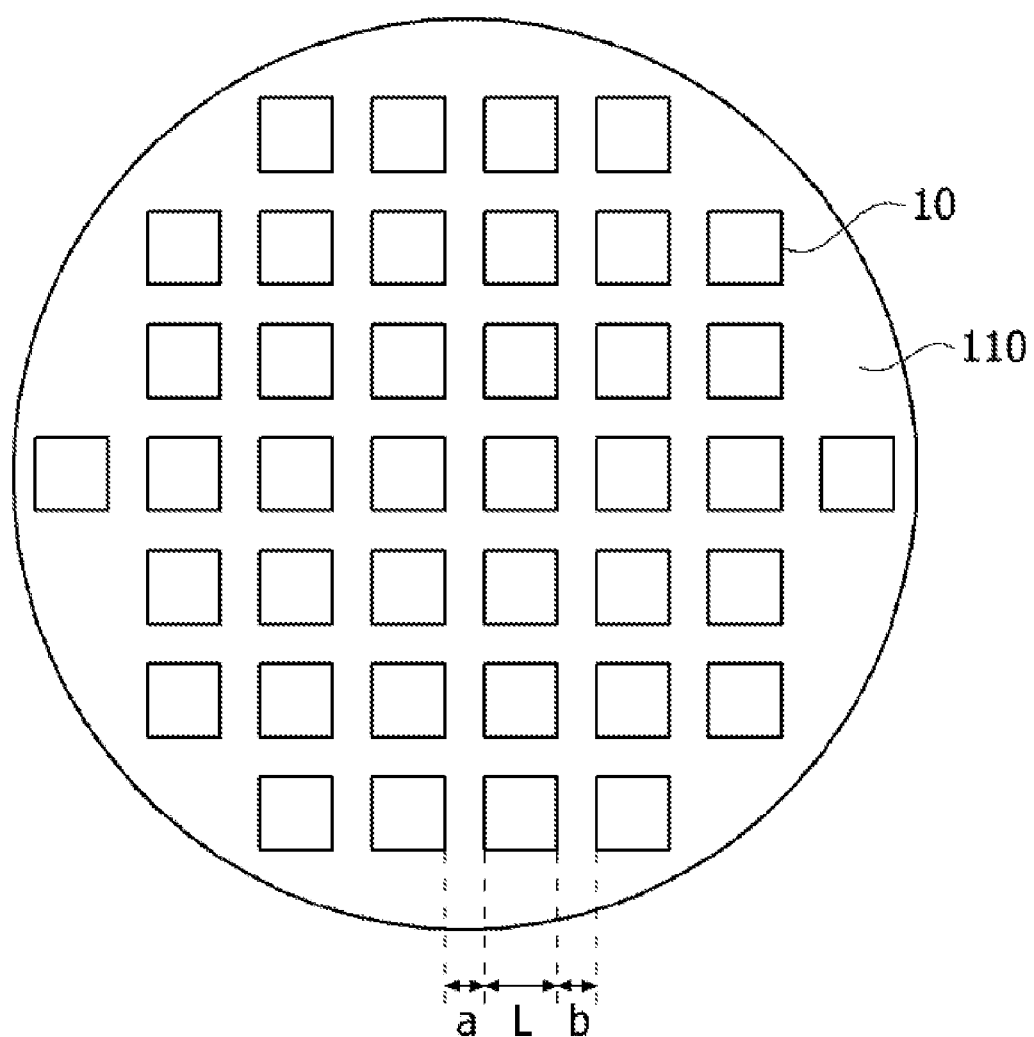

Referring to FIGS. 3A and 3B, step S1 of preparing a substrate 110 with a plurality of semiconductor elements 10 disposed thereon may be performed. In other words, the plurality of semiconductor elements 10 may be formed on the substrate 110. Here, the semiconductor element having reference numeral 10 may refer to a semiconductor element connected to the substrate 110.

First, a sacrificial layer 115, a bonding layer 120, and a semiconductor structure 130 may be sequentially disposed on the substrate 110 in the form of a layer. In addition, parts from the semiconductor structure 130 to the sacrificial layer 115 may be etched so that the semiconductor elements 10 may be disposed on the substrate 110 so as to be spaced apart from each other. In addition, first and second electrodes 141 and 142 may be disposed on exposed first and second conductive semiconductor layers 131 and 132, respectively. Further, an insulating layer 150 may be disposed such that only parts of the first and second electrodes 141 and 142 of the semiconductor element 10 are exposed.

Although only some of the semiconductor elements 10 are shown in FIG. 3A for convenience of description, practically, the plurality of semiconductor elements 10 may be disposed on the substrate 110 as shown in the plan view of FIG. 3B. Of course, the present invention is not limited to the shape of the substrate 110 and the number of the semiconductor elements 10 shown in FIG. 3B.

The substrate 110 may be a transparent, conductive or insulating substrate. The substrate 110 may be a material suitable for growing a semiconductor material or a carrier wafer. The substrate 110 may be formed of a material selected from among sapphire (Al2O3), SiC, Si, GaAs, GaN, ZnO, GaP, InP, Ge, and Ga2O3, but the present invention is not limited thereto.

The sacrificial layer 115 may be disposed on the substrate 110. The sacrificial layer 115 may be removed during the transfer process of the semiconductor element 10. In other words, the sacrificial layer 115 may be a layer for absorbing laser light during the transfer process to be described later. The sacrificial layer 115 may absorb the laser light and be thermally decomposed, and thus gas may be generated. The sacrificial layer 115 may include a monocrystalline, polycrystalline or amorphous phase material combined with hydrogen, nitrogen or oxygen, but the present invention is not limited thereto.

In addition, the sacrificial layer 115 may include oxide or nitride. However, the present invention is not limited thereto. For example, the sacrificial layer 115 may include an oxiade-based material as a material in which deformation occurring during the epitaxial growth is low, and include, for example, GaN, but is not limited thereto.

The bonding layer 120 may be disposed on the sacrificial layer 115 to allow the semiconductor structure 130 to be easily disposed on the sacrificial layer 115. However, when the sacrificial layer 115 is formed of a material similar to that of the semiconductor structure 130, the bonding layer 120 may be omitted.

In addition, the bonding layer 120 and the sacrificial layer 115 may be laminated in reverse order. In other words, after the bonding layer 120 is disposed, the sacrificial layer 115 may be disposed on the bonding layer 120.

Figure 3C:
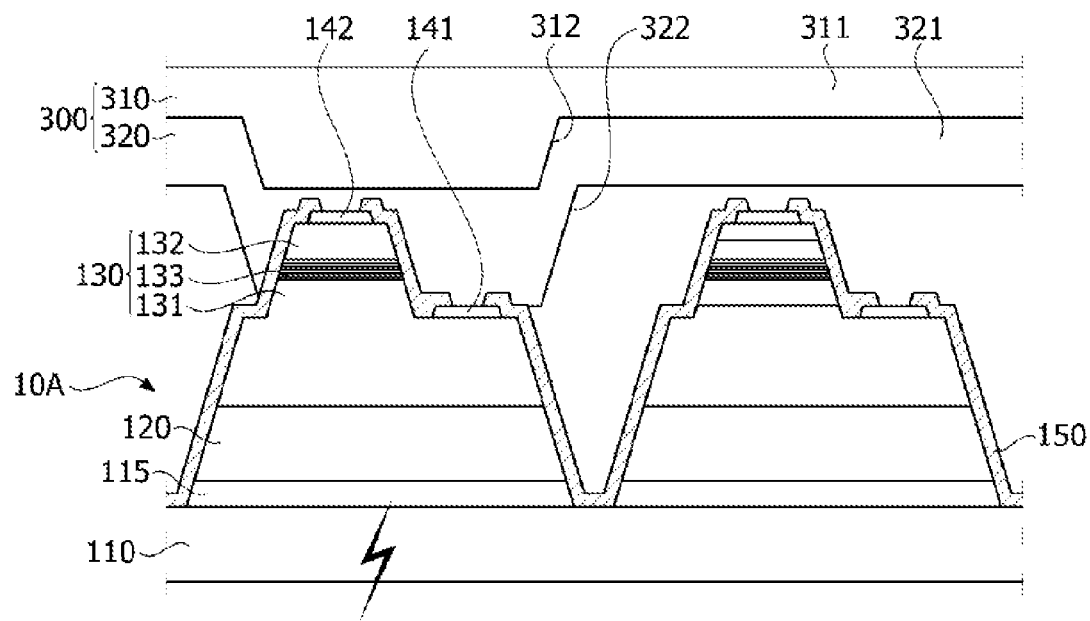
Figure 3D:
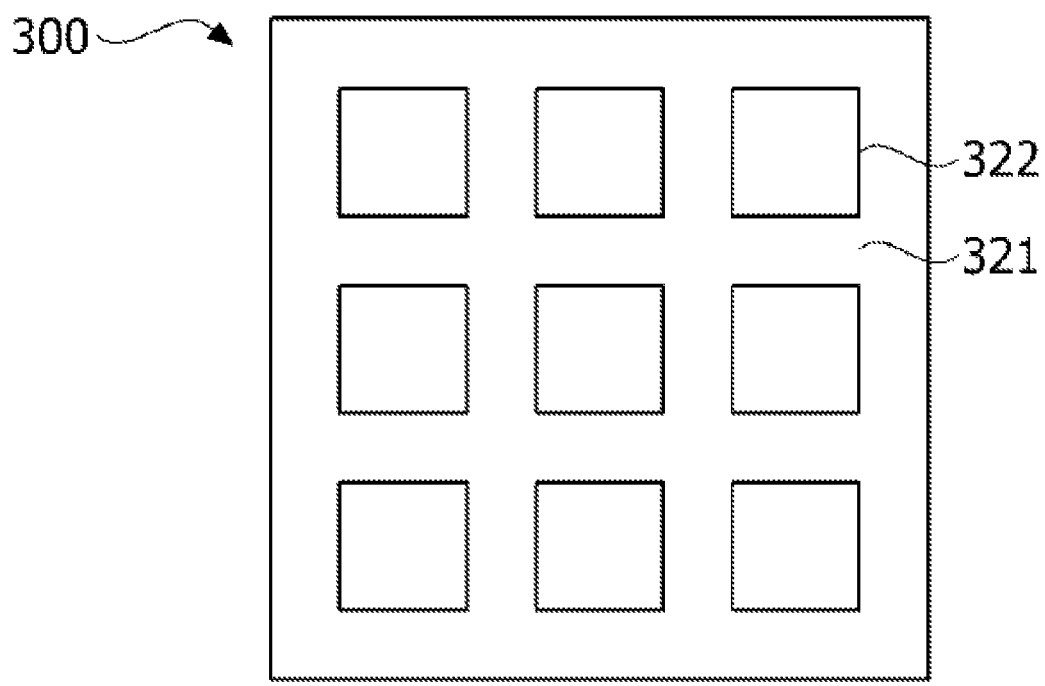

Referring to FIGS. 3C and 3D, step S2 of bonding at least one semiconductor element 10A (hereinafter referred to as a first semiconductor element) to a transfer member 300 may be performed. Here, the first semiconductor element 10A may be bonded to the bonding layer 320 of the transfer member 300.

In step S2, the bonding layer 320 may cover both the first and second electrodes 141 and 142 of the first semiconductor element 10A. Particularly, as shown in the drawing, when the first and second electrodes 141 and 142 are disposed on different planes at an upper portion of the first semiconductor element 10A, the bonding layer 320 may cover both the first and second electrodes 141 and 142. Accordingly, a bonding strength between the bonding layer 320 and the first semiconductor element 10A may be improved. In other words, when the bonding layer 320 covers only a partial area in which the second electrode 142 is disposed, the bonding layer 320 and the first semiconductor element 10A may be separated from each other during movement of the transfer member 300.

Meanwhile, the transfer member 300 may include a transfer layer 310 and the bonding layer 320. In addition, the bonding layer 320 may include a bonding protrusion 322. The first semiconductor element 10A may be bonded to the bonding protrusion 322 of the bonding layer 320.

The transfer layer 310 may include a transparent material. Specifically, the transfer layer 310 may include a material such as sapphire (Al2O3), glass, SU-8, or polydimethylsiloxane (PDMS), but the present invention is not limited thereto.

The bonding layer 320 may be formed of a ultraviolet (UV) photosensitive resin. In other words, the bonding layer 320 may include a material of which properties are changed and the bonding strength is lost due to UV light.

Meanwhile, as shown in FIG. 3D, the bonding layer 320 may include a plurality of bonding protrusions 322. However, the shown structure is not intended to limit the shape of the transfer member 300. The transfer member 300 will be described later in more detail.

Figure 3E:
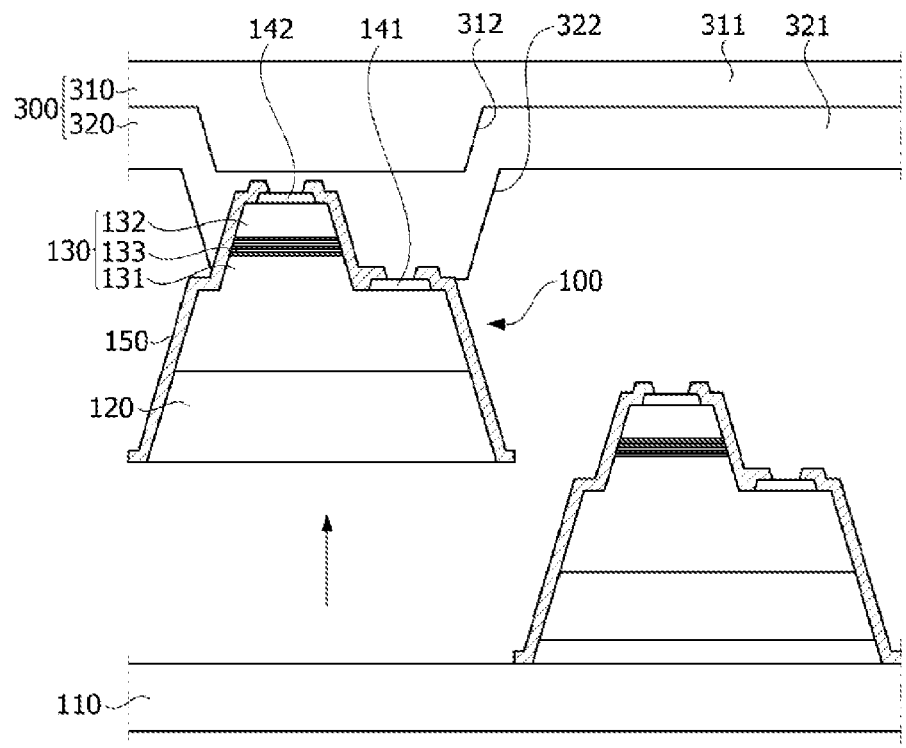

Referring to FIGS. 3C and 3E, step S3 may be performed in which the semiconductor element 100 (hereinafter referred to as a semiconductor chip) is separated from the substrate 110 by irradiating the first semiconductor element 10A with laser. In other words, the sacrificial layer 115 is removed such that the semiconductor chip 100 may be separated from the substrate 110. Here, the semiconductor chip having reference numeral 100 may refer to a semiconductor element separated from the substrate 110. In addition, the semiconductor chip 100 may be the semiconductor element shown in FIG. 1.

In step S3, laser light may be irradiated to a rear surface of the substrate 110 to separate the substrate 110. In other words, the laser light may be irradiated to the opposite side of the area where the first semiconductor element 10A is disposed in the substrate 110. The laser light may be irradiated to correspond to the semiconductor element 10A bonded to the transfer member 300. Accordingly, only selected semiconductor element may be separated from the substrate 110. However, the present invention is not limited thereto, and the laser light may be irradiated to an entirety of the semiconductor element 10.

The substrate 110 may transmit the laser light, and the sacrificial layer 115 may absorb the laser light. When the sacrificial layer 115 absorbs the laser light, a thermo-chemical dissolution reaction may occur in the sacrificial layer 115. Due to the reaction, the sacrificial layer 115 may be removed and the first semiconductor element 10A may be lifted off from the substrate 110. Here, the bonding layer 120 does not exist as described above, and the sacrificial layer 115 is disposed between the semiconductor structure 130 and the substrate 110 so that the sacrificial layer 115 may come into contact with the semiconductor structure 130 and the substrate 110. In this case, the sacrificial layer 115 may be epitaxially grown on the substrate 110 to include GaN and may be decomposed into Ga and N2 by absorbing the laser light having an energy level which decomposes the sacrificial layer 115.

Figure 3F:
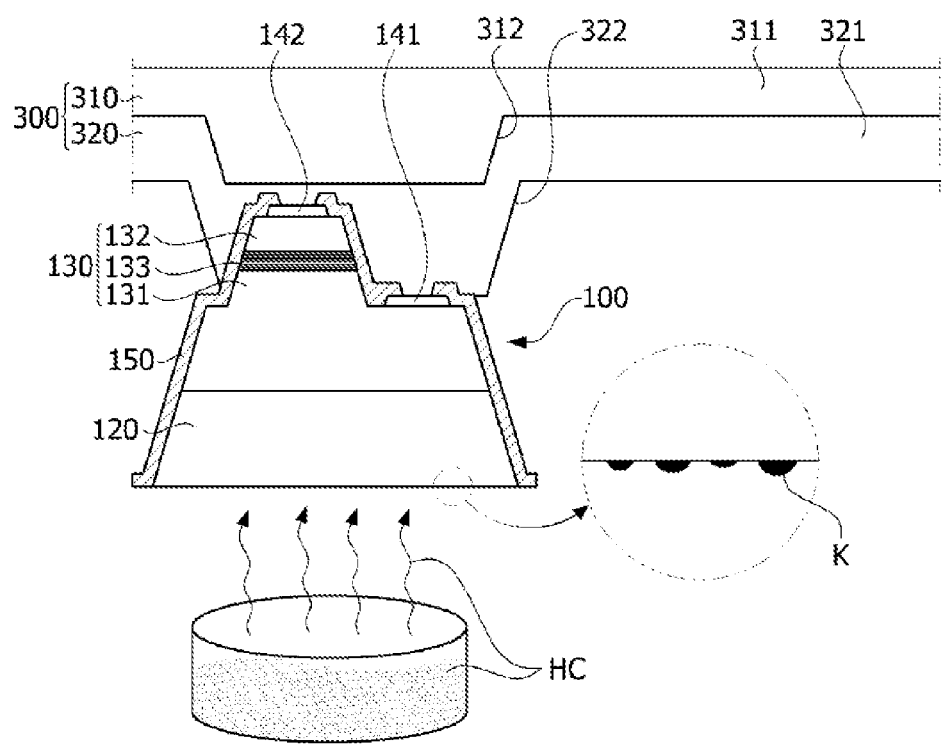

Accordingly, referring to FIG. 3F, a particle K may be present under the separated semiconductor structure 130. For example, a Ga particle may be present under the semiconductor structure 130. As described below, when transferred to a panel substrate 1, the above particle K may inhibit a bonding strength between the panel substrate 1 and the semiconductor structure 130 and generate a crack in the semiconductor structure 130 disposed thereon.

Accordingly, in order to remove the particle K, a first material HC may be applied onto the bottom of the semiconductor structure 130. The first material HC may be an acidic material including HCl.

When the first substance HC applied onto the particle K is a liquid, the semiconductor structure 130 may be separated from the bonding layer 320 or the semiconductor structure 130 other than the particle K may chemically react with the first material HC to cause structural deformation, and accordingly the first material HC may be in a gaseous state.

Accordingly, the process may be performed at a temperature equal to or higher than a boiling point of the first material HC. For example, since the boiling point changes according to the concentration (%) of HCl (for example, the boiling point at 10% concentration of HCl is 103° C. and the boiling point is 108° C. at 20% concentration), the temperature may be changed according to the concentration of HCl.

When the first material HC is applied onto the bottom of the semiconductor structure 130, the first material HC may react with the particle K so that the first material HC may be separated and removed from the bottom of the semiconductor structure 130.

However, the process of removing the particle (FIG. 3F) may be applied when the sacrificial layer 115 and the semiconductor structure 130 are epitaxially grown on the substrate without the bonding layer 120 and may not be applied when the bonding layer 120 is present.

In addition, gas may be generated due to the reaction of the sacrificial layer 115.

Meanwhile, the semiconductor chip 100 may be separated from the substrate 110 while being bonded to the transfer member 300. Here, the insulating layer 150 disposed between the adjacent semiconductor elements 10 on the substrate 110 may also be separated.

In step S3, only the selected semiconductor chip 100 may be separated from the substrate 110. For example, the selected semiconductor chip 100 may be transferred by the movement of the transfer member 300. Accordingly, some of the semiconductor chips 100 bonded to the transfer member 300 may be separated, and the remaining semiconductor chips (semiconductor elements) not bonded to the transfer member 300 may be disposed on the substrate 110.

Accordingly, the semiconductor chip 100 is selectively transferred, and then the selected semiconductor chip 100 is transferred onto the panel so that red, green and blue (RGB) pixels can be easily implemented.

Figure 3G:
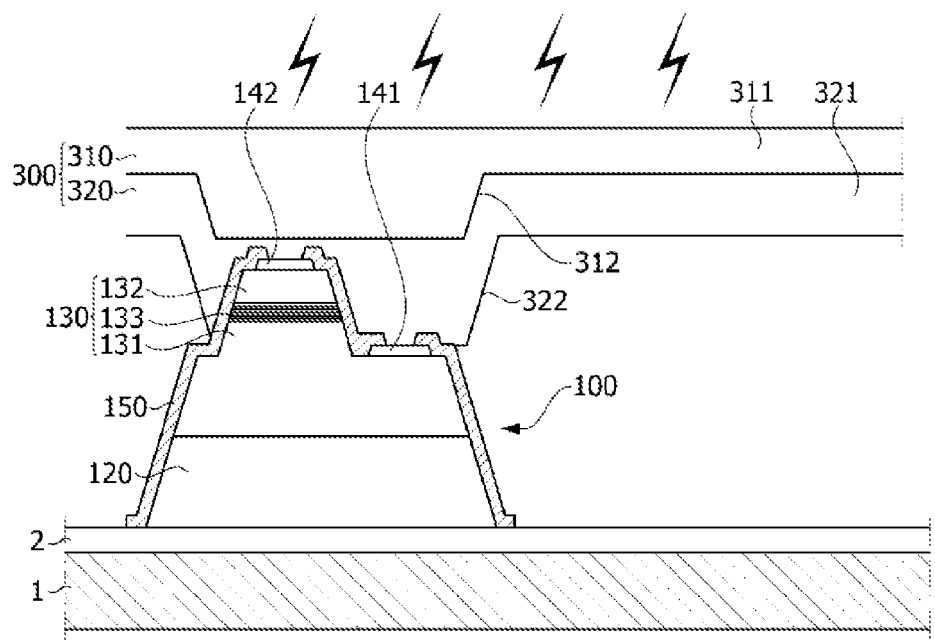

Referring to FIG. 3G, step S4 of disposing the semiconductor chip 100 on the panel substrate 1 may be performed. Here, the semiconductor chip 100 may be moved while being bonded to the transfer member 300. In other words, the semiconductor chip 100 may be disposed on the panel substrate 1 by the movement of the transfer member 300.

A fixing layer 2 may be disposed on the panel substrate 1. The semiconductor chip 100 may be fixed on the panel substrate 1 by the fixing layer 2. The fixing layer 2 may be formed of a general adhesive material. Particularly, the fixing layer 2 may include a material which is cured by UV light. Meanwhile, the panel substrate 1 may be the planarization layer 214 shown in FIG. 2. In addition, the fixing layer 2 may be the fixing layer 220 shown in FIG. 2. However, the panel substrate 1 may be the substrate 210 shown in FIG. 2 in some cases.

Figure 3H:
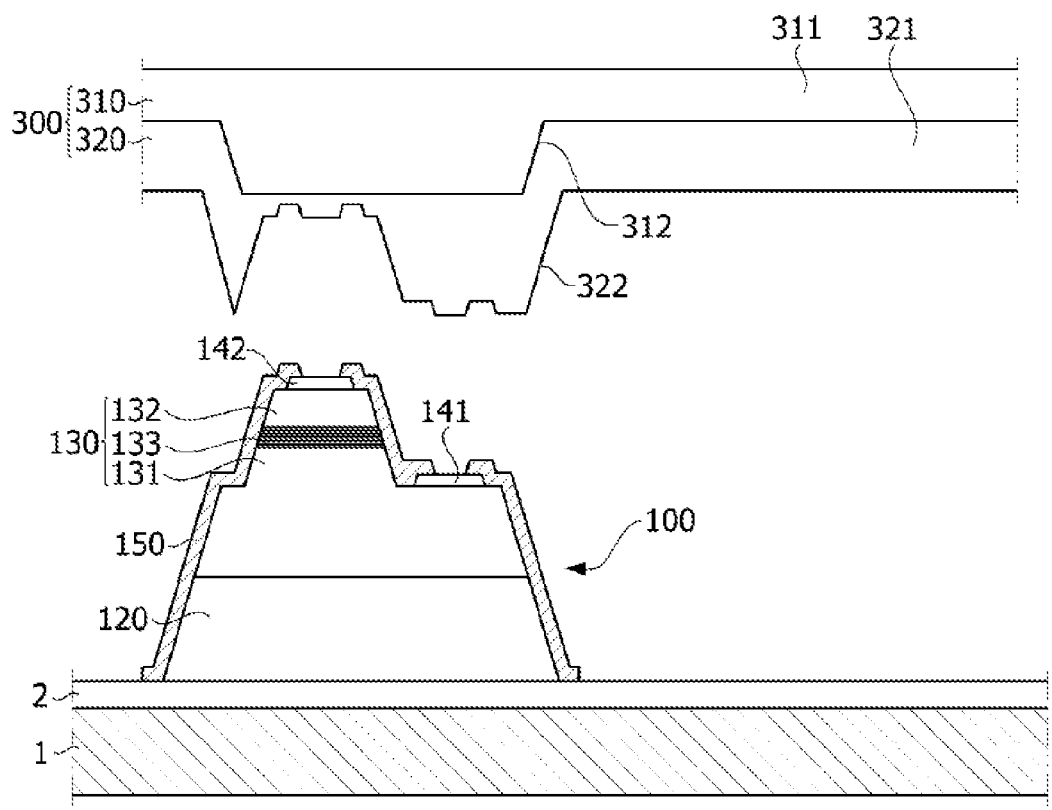

Referring to FIGS. 3G and 3H, step S5 may be performed in which the transfer member 300 is irradiated with light so that the semiconductor chip 100 is separated from the transfer member 300 and coupled to the panel substrate 1. Here, the light may be irradiated from the top of the transfer member 300. The light irradiated to the semiconductor chip 100 may be UV light.

The light may be transmitted through the transfer layer 310 and absorbed by the bonding layer 320 and the fixing layer 2. Here, the bonding layer 320 may lose the bonding strength by absorbing the light. On the contrary, the fixing layer 2 may be cured by absorbing the light. In other words, when the light is irradiated, the semiconductor chip 100 may be separated from the bonding layer 320. In addition, when the light is irradiated, the semiconductor chip 100 may be bonded onto the panel substrate 1.

The display device according to the present invention may be manufactured by repeating the above steps S1 to S5.

Figure 4A:
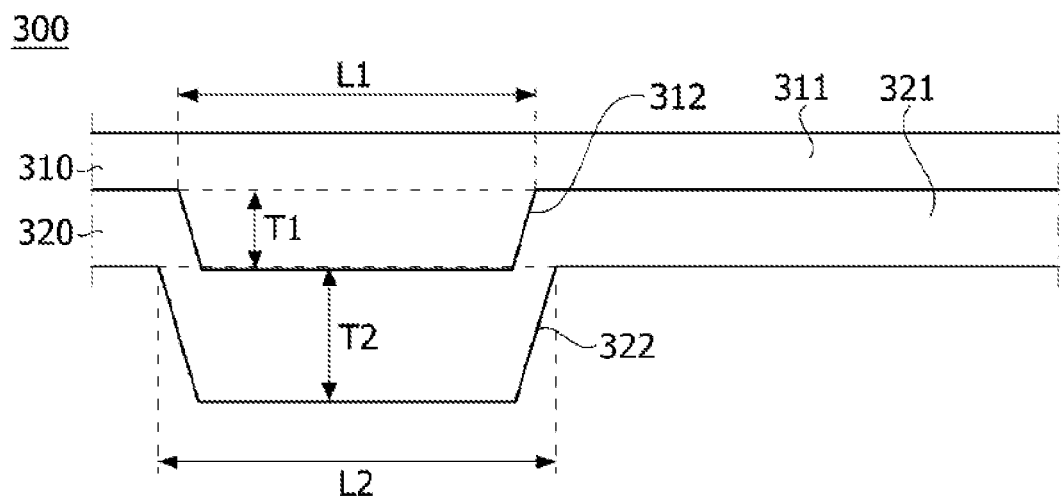
FIG. 4A is a sectional view of a transfer member for manufacturing a display device according to an embodiment of the present invention.
Figure 4B:
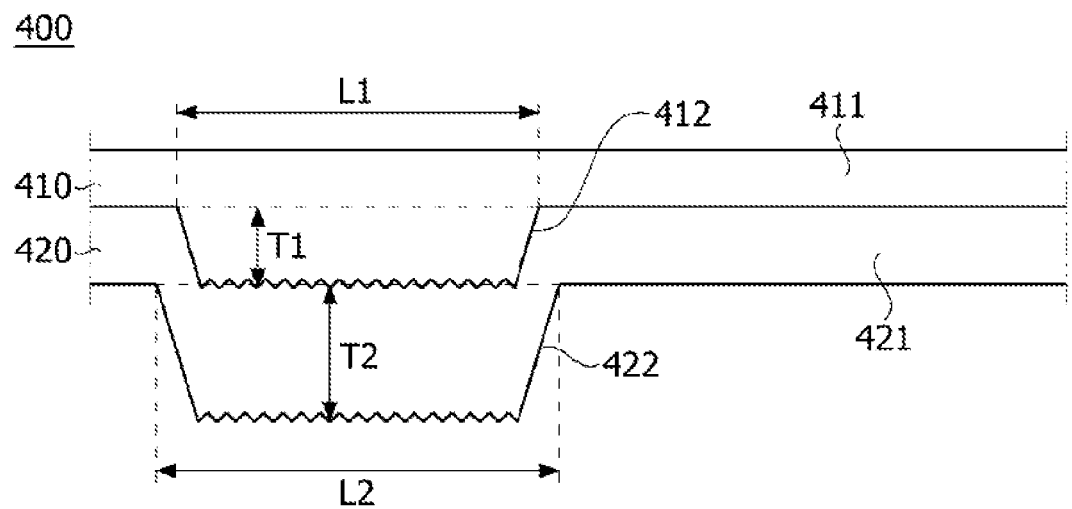
FIG. 4B is a modified example of FIG. 4A.

FIG. 4A is a sectional view of a transfer member for manufacturing a display device according to an embodiment of the present invention. FIG. 4B is a modified example of FIG. 4A Referring to FIG. 4A, the transfer member 300 may include a transfer layer 310 and a bonding layer 320. The transfer member 300 shown in FIG. 4A may be only partially shown for convenience of description.

The transfer layer 310 may form a basic frame of the transfer member 300. The transfer layer 310 may be connected to a driving unit (not shown) and moved vertically and laterally. In other words, the process such as bonding, moving, and transferring of the semiconductor chip 100 may be performed by the movement of the transfer layer 310.

The transfer layer 310 may include a main plate 311 and a transfer protrusion 312. The main plate 311 may be formed in a flat plate shape, but the present invention is not limited thereto. The transfer protrusion 312 may protrude from one surface of the main plate 311. A plurality of transfer protrusions 312 may be provided as in the bonding protrusions 322 shown in FIG. 3D. The semiconductor chip 100 may be selectively transferred by the transfer protrusion 312.

The bonding layer 320 may be disposed to cover one surface of the transfer layer 310. The bonding layer 320 may be disposed in an area of the transfer layer 310 on which the transfer protrusion 312 is disposed. The bonding layer 320 may include a resin and, particularly, include a material having a bonding strength lowered by UV light. The bonding layer 320 may be formed on one surface of the transfer layer 310 by spray coating or the like, but the present invention is not limited thereto.

The bonding layer 320 may include a main plate 321 and a bonding protrusion 322. The bonding protrusion 322 may protrude from the main plate 321. The main plate 321 may correspond to the main plate 311 of the transfer layer 310. The bonding protrusion 322 may correspond to the transfer protrusion 312. The bonding protrusion 322 may be bonded to the semiconductor chip 100 substantially. The semiconductor chip 100 may be selectively transferred by the bonding protrusion 322.

Specifically, the transfer protrusion 312 protrudes from the main plate 311, and thus the bonding protrusion 322 may also protrude from the main plate 321. Accordingly, only the semiconductor chip 100 corresponding to the above protruding area is selectively bonded so that the desired transfer process of the semiconductor chip can be performed.

In other words, at least one of the semiconductor elements 100 disposed on the substrate may be selected and bonded by the bonding protrusion 322. Then, as described above, the first semiconductor element 10A may be transferred to a display panel by laser irradiation and ultraviolet irradiation.

A width L1 of the transfer protrusion 312 may be equal to or larger than a width L (FIG. 3A) of the first semiconductor element 10A. When the width L1 of the transfer protrusion is smaller than the width L of the first semiconductor element, the bonding strength between the transfer member 300 and the first semiconductor element 10A may be reduced. In addition, the width L1 of the transfer protrusion may be smaller than the sum (L+a+b) of the width L of the first semiconductor element and spacing distances a and b (FIG. 3B) between the adjacent semiconductor elements. When the width L1 of the transfer protrusion is larger than the sum of the width L of the first semiconductor element and the spacing distances a and b, a semiconductor element other than the semiconductor element to be selected may bonded to the transfer member 300.

A width L2 of the bonding protrusion 322 may be larger than the width L1 of the transfer protrusion 312. This is because the bonding protrusion 322 is coated on the transfer protrusion 312. For the same reason, the width L2 of the bonding protrusion 322 may be equal to or higher than the width L (FIG. 3A) of the first semiconductor element 10A. In addition, the width L2 of the bonding protrusion 322 may be smaller than the sum (L+a+b) of the width L of the first semiconductor element and the spacing distances a and b between the adjacent semiconductor chips.

Meanwhile, the widths and thicknesses of the transfer protrusion 312 and the bonding protrusion 322 herein have been defined in comparison with the width and thickness of the first semiconductor element shown in FIG. 3A but may be defined in comparison with the width and thickness of the semiconductor element shown in FIG. 1.

The width L1 of the transfer protrusion 312 may be one to five times the width L of the first semiconductor element 10A. When the width L1 of the transfer protrusion is smaller than the width L of the first semiconductor chip, the first semiconductor element 10A may be separated from the transfer member 30. In other words, when a size of the transfer protrusion 312 is small, a size of the bonding protrusion 322 coated on the transfer protrusion 312 also becomes small, and thus the bonding strength between the bonding protrusions 322 and the first semiconductor element 10A may be reduced. When the width L2 of the transfer protrusion is larger than 5 times the width L of the first semiconductor element, the efficiency and accuracy of the process may be deteriorated. In other words, the overall length of the transfer member 300 may become unnecessarily long.

A thickness T1 of the transfer protrusion 312 may be one to ten times a thickness T of the first semiconductor element 10A. When the thickness T1 of the transfer protrusion is smaller than the thickness T of the first semiconductor element, the accuracy of the process may be deteriorated. In other words, a semiconductor element other than the semiconductor element to be selected may be bonded to the main plate 311 of the transfer member 300. When the thickness T1 of the transfer protrusion is larger than 10 times the thickness T of the first semiconductor element, the overall thickness of the transfer member 300 may unnecessarily become thick, and thus the efficiency of the process may be deteriorated.

A thickness T2 of the bonding protrusion 322 may range from 1 μm to 50 μm. When the thickness of the bonding protrusion 322 is less than 1 μm, the bonding strength between the bonding protrusions 322 and the first semiconductor element 10A may be reduced. When the thickness of the bonding protrusion 322 is larger than 50 μm, the overall thickness of the transfer member 300 may unnecessarily become thick, and thus the efficiency of the process may be deteriorated. In addition, the consumption amount of the material of the bonding layer 320 increases, and thus the manufacturing cost may increase.

Referring to FIG. 4B, a transfer member 400 may include a transfer layer 410 and a bonding layer 420 as in FIG. 4A. The transfer layer 410 may include a main plate 411 and a transfer protrusion 412. The bonding layer 420 may include a main plate 421 and a bonding protrusion 422.

A protruding surface of the transfer protrusion 412 may have a concavo-convex structure. In addition, a protruding surface of the bonding protrusion 422 may also have a concavo-convex structure. In other words, the same configuration and function as those of the transfer member 300 of FIG. 4A may be applied to the transfer member 400 of FIG. 4B in addition to the concavo-convex structure. When the transfer protrusion 412 and the bonding protrusion 422 of the transfer member 400 have the concavo-convex structures, the bonding of the semiconductor element may be easily performed.

The transfer members 300 and 400 according to the present invention may be formed by coating the transfer layers 310 and 410 with the bonding layers 320 and 420, respectively so that the selective transfer process of the semiconductor chip can be easily performed. Particularly, after the transfer process of the semiconductor chip, only the bonding layers 320 and 420 may be removed and re-coated for use so that the cost can be reduced.

In other words, contaminants are highly likely to adhere to the bonding layers 320 and 420 during the process, and the bonding strength may be reduced by ultraviolet rays. Accordingly, it may be difficult to use the bonding layers 320 and 420 repeatedly. However, according to the present invention, only the bonding layers 320 and 420 having a relatively small thickness may be coated, removed and re-coated for use with respect to the base frames of the transfer layers 310 and 410, respectively. Accordingly, the consumption of material is reduced compared with the case in which the transfer members 300 and 400 are repeatedly manufactured and used so that the manufacturing cost can be reduced.

Figure 5:
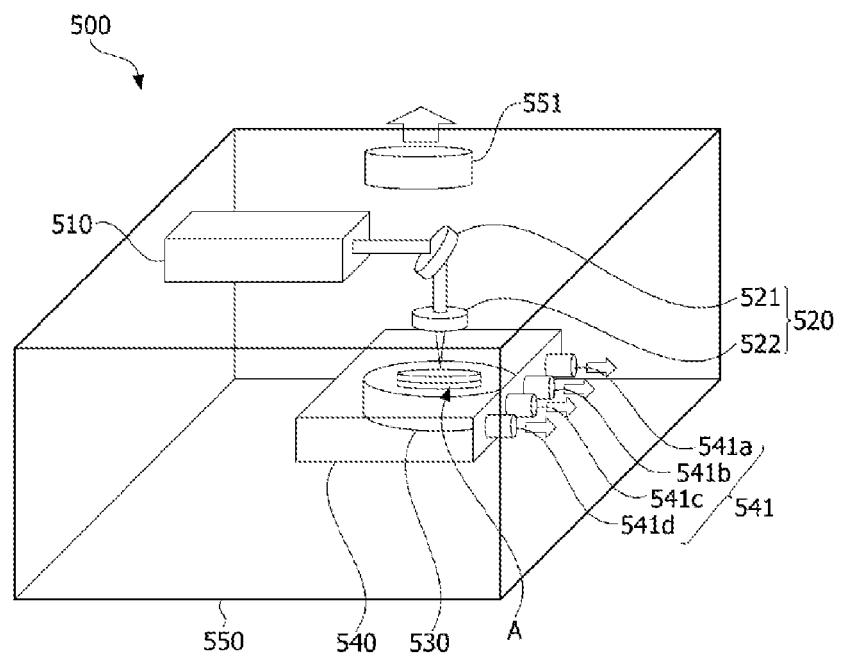
FIG. 5 is a perspective view of a laser lift-off device for manufacturing a display device according to an embodiment of the present invention.
Figure 6A:
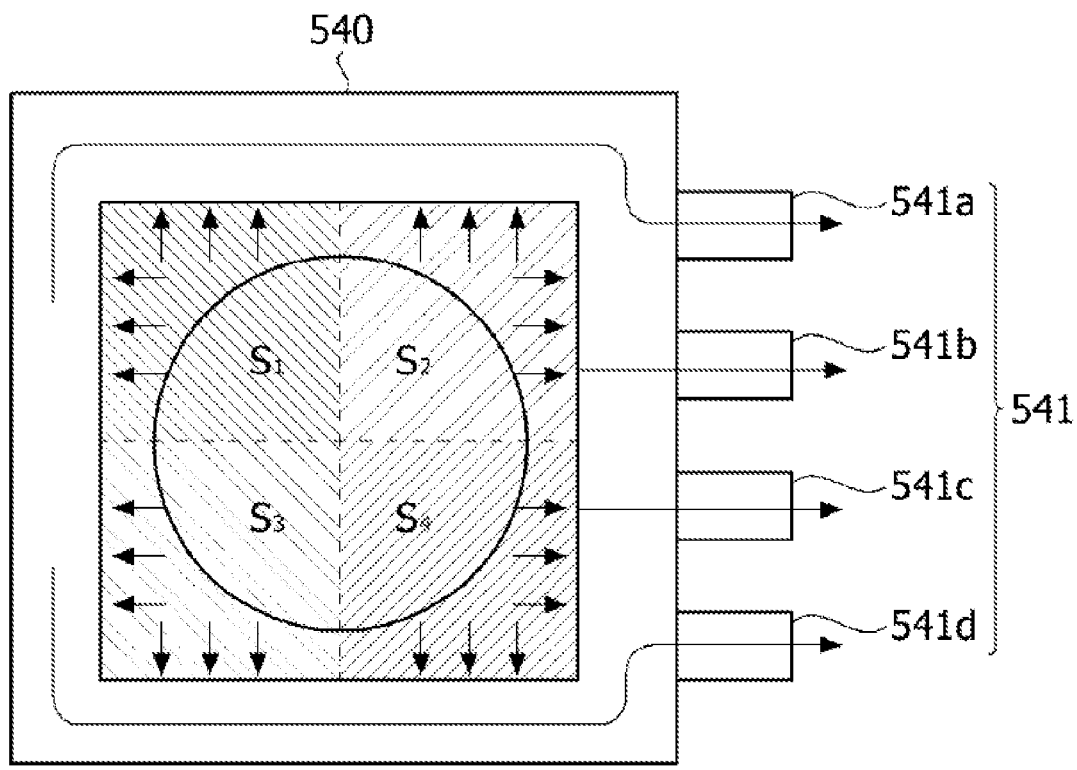
FIG. 6A is a plan view of the laser lift-off device for manufacturing a display device according to an embodiment of the present invention.
Figure 6B:
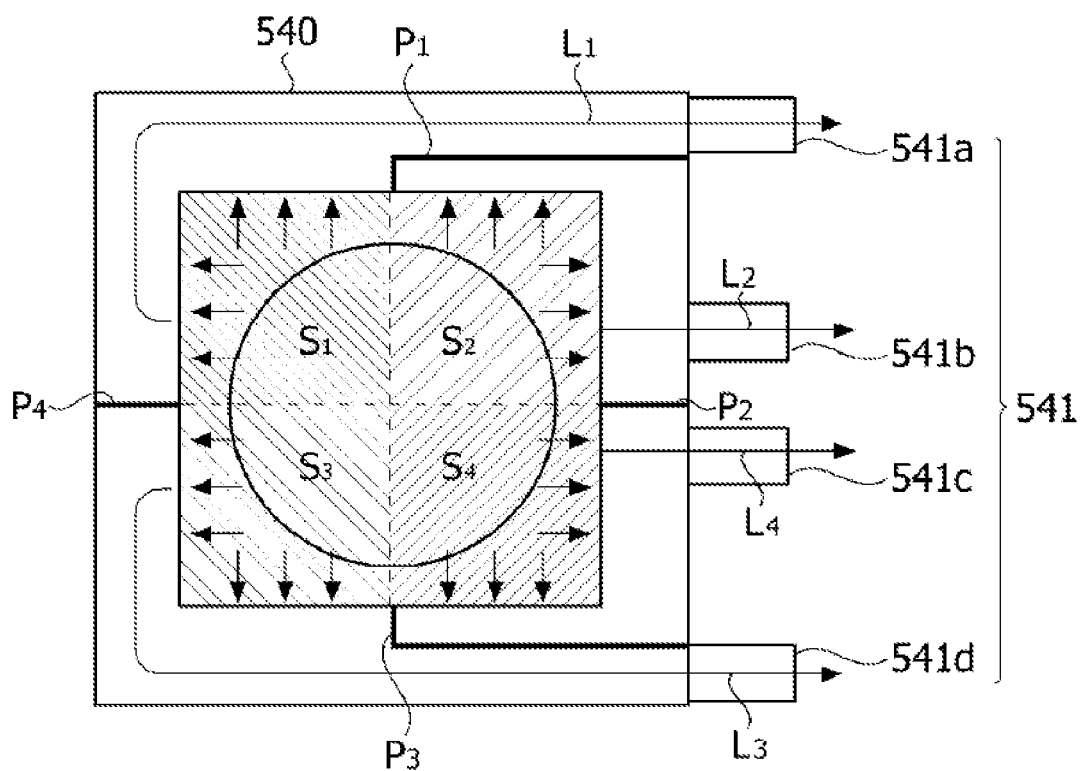
FIG. 6B is a modified example of FIG. 6A.
Figure 7A:
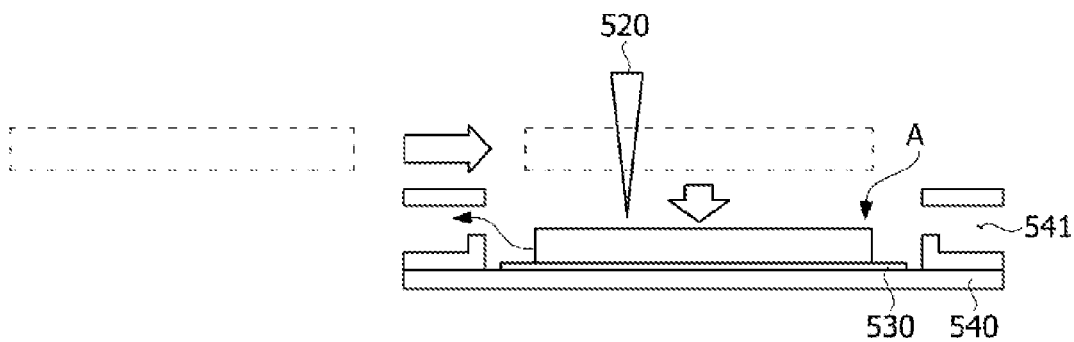
FIG. 7A is a sectional view of the laser lift-off device for manufacturing a display device according to an embodiment of the present invention.
Figure 7B:
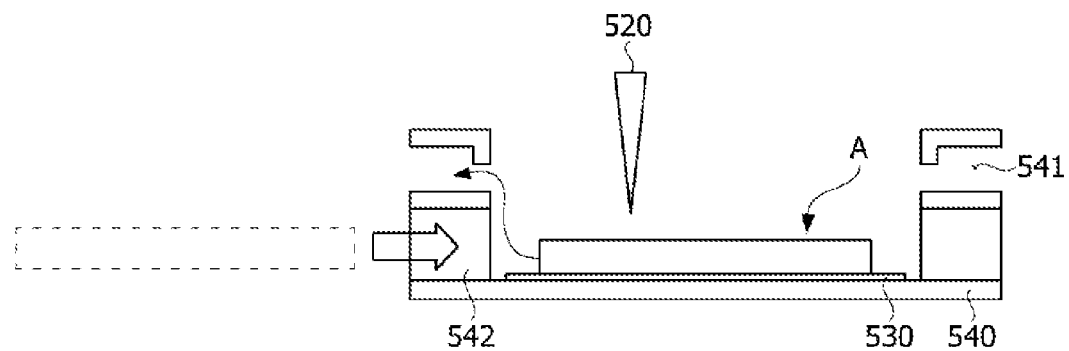
FIG. 7B is a modified example of FIG. 7A.

FIG. 5 is a perspective view of a laser lift-off device for manufacturing a display device according to an embodiment of the present invention. FIG. 6A is a plan view of a laser lift-off device for manufacturing a display device according to an embodiment of the present invention. FIG. 6B is a modified example of FIG. 6A. FIG. 7A is a sectional view of a laser lift-off device for manufacturing a display device according to an embodiment of the present invention. FIG. 7B is a modified example of FIG. 7A.

Referring to FIGS. 5 to 7B, a laser lift-off device 500 may include a laser unit 510, an optical unit 520, a stage 530, an accommodation unit 540, and a housing 550. The laser lift-off device 500 may be a device for performing step S3.

The laser unit 510 may emit laser light. The laser unit 510 may be a KrF excimer laser, but the present invention is not limited thereto. In addition, a laser source may be a pulse oscillation type, but the present invention is not limited thereto.

The optical unit 520 may include a lens group 521 and a mask 522. The lens group 521 may enlarge or shape a beam of the laser light emitted from the laser unit 510. The mask 522 may irradiate the laser light emitted from the lens group 521 to have a desired pattern. In other words, the mask 522 may include an opening of a specific irradiation pattern shape to irradiate laser light of a desired pattern.

A wafer A may be disposed on the stage 530. Here, the wafer A may refer to the substrate 110 with the plurality of semiconductor elements 10 (FIG. 3A) disposed thereon. In addition, the first semiconductor element 10A may be bonded to the transfer member 300 on the stage 530 (FIG. 3C). Further, the sacrificial layer 115 may be removed on the stage 530 by irradiating the laser light, and the semiconductor chip 100 may be separated from the substrate 110 (FIG. 3E). Then, the separated semiconductor chip 100 may be transferred onto the panel substrate 1 outside the laser lift-off device 500 by the transfer member 300 (FIG. 3G).

Meanwhile, in the case of the laser lift-off device 500 shown in FIG. 5, the transfer member 300 may be disposed thereunder. In addition, the substrate 110 may be disposed thereon. In other words, although FIG. 3 shows that the substrate 110 is disposed under the semiconductor chip 100 and the transfer member 300 is disposed on the substrate 110, the process may be performed in an inverted manner. In other words, in the device of FIG. 5, the laser light may be irradiated toward the substrate 110 from the top, and the semiconductor chip 100 may be transferred through the transfer member 300 disposed thereunder. However, the present invention is not limited thereto. In addition, although not shown in the drawings, the substrate 110 may be fixed onto the stage 530 by a separate fixing member.

The accommodation unit 540 may be a space in which the stage 530 is accommodated. The accommodation unit 540 may include at least one exhaust hole 541. The exhaust hole 541 may discharge the gas generated by the dissolution reaction of the sacrificial layer 115 to the outside of the accommodation unit 540.

Specifically, the first semiconductor element 10A disposed on the stage 530 may be irradiated with the laser light. The laser light may transmit through the substrate 110 and cause the thermo-chemical dissolution reaction in the sacrificial layer 115. Accordingly, the sacrificial layer 115 may be removed, and the first semiconductor element 10A may be lifted off from the substrate 110. Here, due to the thermo-chemical dissolution reaction of the sacrificial layer 115, the gas of the material constituting the sacrificial layer 115 may be generated.

Particularly, when the first semiconductor element 10A is formed of a material such as arsenic (As) or phosphorus (P), harmful gas of the material may be generated by the thermo-chemical dissolution reaction. Particularly, when the first semiconductor element 10A is formed based on a GaAs substrate so that the first semiconductor element 10A serves as a light emitting device (red) including arsenic, phosphorus, and the like, the sacrificial layer 115 may also include the above material. In this case, a structure may be required for effectively discharging the harmful gas.

Of course, the light emitting device of the present invention is not limited to the red light emitting device. Even though the red light emitting device is applied, a sacrificial layer not containing arsenic and phosphorous may be used.

Referring to FIG. 6A, the stage 530 may be divided into a plurality of areas. For example, the stage 530 may be divided into four areas: a first area S1, a second area S2, a third area S3, and a fourth area S4. In addition, the exhaust hole 541 of the accommodation unit 540 may include a plurality of first to fourth exhaust holes 541a, 541b, 541c, and 541d. The gas generated from one of the first to fourth areas S1, S2, S3, and S4 may be discharged to the outside through one of the first to fourth exhaust holes 541a, 541b, 541c, and 541d.

Referring to FIG. 6B, a plurality of partitions P1, P2, P3, and P4 may be further disposed in the structure of FIG. 6A. First to fourth flow paths L1, L2, L3, and L4 may be formed inside the accommodation unit 540 by the first to fourth partitions P1, P2, P3, and P4. Accordingly, the gas discharged from the first area S1 may be discharged to the first exhaust hole 541a through the first flow path L1. The gas discharged from the second area S2 may be discharged to the second exhaust hole 541b through the second flow path L2. The gas discharged from the third area S3 may be discharged to the fourth exhaust hole 541d through the third flow path L3. The gas discharged from the fourth area S4 may be discharged to the third exhaust hole 541c through the fourth flow path L4.

As in the above description, the plurality of the exhaust holes 541a, 541b, 541c, and 541d are arranged in the accommodation unit 540 so that the gas generated during the laser lift-off process may be effectively discharged to the outside.

The housing 550 may accommodate the laser unit 510, the optical unit 520, the stage 530, and the accommodation unit 540. The housing 550 may include an exhaust part 551 disposed at an upper portion thereof. The exhaust part 551 may discharge the remaining gas among the gas discharged through the exhaust hole 541. The exhaust part 551 may also include a plurality of exhaust holes but is not limited thereto.

Meanwhile, Referring to FIG. 7A, the wafer A may be moved to be disposed on the stage 530. The wafer A may be loaded onto the stage 530 through an upper portion of the exhaust hole 541 of the accommodation unit 540 by a moving device (not shown).

Alternatively, referring to FIG. 7B, the wafer A may be loaded onto the stage 530 through a lower portion of the exhaust hole 541 by the moving device (not shown). Here, a moving slit 542 may be arranged under the exhaust hole 541. The moving slit 542 may be opened or closed when the wafer A is loaded onto the stage 530.

As the above description, the wafer A may be loaded onto the stage 530 by the moving device. Here, the wafer A may be disposed such that the substrate 110 faces the optical unit 520. In other words, the shape shown in FIG. 3C may be arranged in the vertically reversed direction. In addition, although not shown in the drawings, at least one first semiconductor element 10A of the wafer A may be bonded to the transfer member 300 on the stage 530.

In addition, the sacrificial layer 115 may be removed by the laser light irradiated from the optical unit 520 so that the gas may be generated. The gas may be easily discharged to the outside through the exhaust hole 541. In addition, the semiconductor chip 100 separated from the wafer A (or the substrate 110) may be transferred onto the panel substrate outside the housing 550 by the transfer member 300.

The display device according to the embodiment of the present invention may be implemented in standard definition (SD) resolution (760×480), high definition (HD) resolution (1280×720), full HD (FHD) resolution (1920×1080), ultra HD (UHD) resolution (3480×2160), or resolution beyond UHD (such as 4K and 8K (K=1000)). Here, the plurality of semiconductor chips according to the embodiment may be arrayed and connected according to the resolution.

The display device may be an electric signboard or TV having a diagonal size of 100 inches or more and have a pixel implemented by a light emitting diode (LED). Accordingly, power consumption can be decreased, a longer lifespan can be provided at a low maintenance cost, and a self-luminous display having high luminance can be provided.

According to the embodiments of the present invention, videos and images are implemented using the semiconductor chip so that color purity and color reproduction can be excellent.

According to the embodiments of the present invention, the videos and images are implemented using a light emitting device package having excellent linearity so that the display device having a large-sized of 100 inches or more can be implemented to be clear.

According to the embodiments, a large-sized display device of 100 inches or more with high resolution can be implemented at low cost.

The semiconductor chip according to the embodiment may further include an optical member such as a light guide plate, a prism sheet, and a diffusion sheet, and function as a backlight unit. In addition, the semiconductor chip according to the embodiments may be further applied to a display device, a lighting device, and an indication device.

Here, the display device may include a bottom cover, a reflecting plate, a light emitting module, a light guide plate, an optical sheet, a display panel, an image signal output circuit, and a color filter. The bottom cover, the reflective plate, the light emitting module, the light guide plate, and the optical sheet may constitute the backlight unit.

The reflective plate may be disposed on the bottom cover, and the light emitting module may emit light. The light guide plate may be disposed in front of the reflective plate to guide the light emitted from the light emitting module forward, and the optical sheet may include a prism sheet or the like and be disposed in front of the light guide plate. The display panel may be disposed in front of the optical sheet, the image signal output circuit may supply an image signal to the display panel, and the color filter may be disposed in front of the display panel.

In addition, the lighting device may include a light source module including the substrate and the semiconductor chip according to the embodiments, a heat dissipation unit configured to dissipate heat of the light source module, and a power supply unit configured to process or convert an electric signal provided from the outside to provide the electric signal to the light source module. Further, the lighting device may include a lamp, a head lamp, and a street lamp.

In addition, a camera flash of a mobile terminal may include the light source module including the semiconductor chip according to the embodiments.

Although the exemplary embodiments have been proposed and set forth in the aforementioned description, the present invention should not be construed as limited thereto. It will be apparent that various deformations and modifications not illustrated are available within the scope without departing from inherent features of the embodiments of the present invention by a person having ordinary skill in the art. For example, each component specifically shown in the embodiments may be carried out with the modifications. In addition, it is apparent that differences relevant to the modifications and deformations are included in the scope of the embodiments set in the accompanying claims of the present invention.

The invention claimed is:

1. A display device manufacturing method comprising:
    preparing a substrate with a plurality of semiconductor chips disposed thereon (S1);
    bonding at least one first semiconductor chip among the semiconductor chips to a transfer member (S2);
    separating the first semiconductor chip from the substrate by irradiating the first semiconductor chip with laser light (S3);
    disposing the first semiconductor chip on a panel substrate of a display device using the transfer member (S4); and
    separating the first semiconductor chip from the transfer member by irradiating the transfer member with light (S5),
    wherein the transfer member includes a transfer layer and a bonding layer disposed on one surface of the transfer layer, the bonding layer includes at least one bonding protrusion, and the first semiconductor chip in step S2 is bonded to the bonding protrusion,
    step S3 is performed in a laser lift-off device;
    the laser lift-off device includes a laser unit which irradiates the laser light, a stage on which the substrate is disposed, and an accommodation unit accommodating the stage and including at least one exhaust hole; and
    the at least one exhaust hole is region where a gas which is generated when the a sacrificial layer is decomposed is discharged to an outside.

2. The display device manufacturing method of claim 1, wherein the semiconductor chip includes:
    a semiconductor structure including a first conductive semiconductor layer, a second conductive semiconductor layer, and an active layer disposed between the first conductive semiconductor layer and the second conductive semiconductor layer;
    a first electrode connected to the first conductive semiconductor layer;

a second electrode connected to the second conductive semiconductor layer; and an insulating layer covering the semiconductor structure while exposing only parts of the first and second electrodes.

3. The display device manufacturing method of claim 2, wherein, in step S3, particles disposed under the first semiconductor chip are removed to separate the substrate in step S3.

4. The display device manufacturing method of claim 3, wherein, in step S3, a first material is applied to a lower portion of the first semiconductor chip, and the first material is an acidic material.

5. The display device manufacturing method of claim 3, wherein the plurality of areas includes a flow path through which gas is discharged.

6. The display device manufacturing method of claim 2, wherein, in step S2, the bonding protrusion is bonded to the first semiconductor chip to cover the first electrode and the second electrode.

7. The display device manufacturing method of claim 1, wherein the sacrificial layer is disposed between the first semiconductor chip and the substrate in step S1, and the sacrificial layer is decomposed in step S3.

8. The display device manufacturing method of claim 7, wherein:
the laser light removes the sacrificial layer.

9. The display device manufacturing method of claim 1, wherein the transfer layer includes at least one transfer protrusion protruding from the one surface of the transfer layer, and the bonding protrusion corresponds to the transfer protrusion.

10. The display device manufacturing method of claim 9, wherein the transfer protrusion includes a concavo-convex structure.

11. The display device manufacturing method of claim 9, wherein a width of the transfer protrusion is larger than a width of the first semiconductor chip.

12. The display device manufacturing method of claim 11, wherein the width of the transfer protrusion is smaller than a sum of a width of the first semiconductor chip and a distance between the adjacent first semiconductor chips.

13. The display device manufacturing method of claim 1, wherein a fixed layer is disposed between the panel substrate and the first semiconductor chip in step S4, and the fixed layer is cured in step S5.

14. The display device manufacturing method of claim 1, wherein the bonding protrusion has a thickness in a range from 1 μm to 50 μm.

15. The display device manufacturing method of claim 1, wherein the bonding protrusion includes a concavo-convex structure.

16. The display device manufacturing method of claim 1, wherein a width of the bonding protrusion is smaller than a sum of a width of the first semiconductor chip and a distance between the adjacent first semiconductor chips.

17. The display device manufacturing method of claim 1, wherein the laser lift-off device further comprises an optical unit for changing a pattern of the laser light.

18. The display device manufacturing method of claim 1, wherein the first semiconductor chip comprises arsenic or phosphorous.

19. The display device manufacturing method of claim 1, the sacrificial layer comprises oxide or nitride.

20. The display device manufacturing method of claim 1, wherein the stage comprises a plurality of areas divided by a partition.

* * * * *